United States Patent
Fibranz

(10) Patent No.: US 7,245,554 B2
(45) Date of Patent: Jul. 17, 2007

(54) INTEGRATED SEMICONDUCTOR MEMORY WITH CLOCK-SYNCHRONOUS ACCESS CONTROL

(75) Inventor: Heiko Fibranz, München (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/352,393

(22) Filed: Feb. 13, 2006

(65) Prior Publication Data

US 2006/0197553 A1 Sep. 7, 2006

(30) Foreign Application Priority Data

Feb. 11, 2005 (DE) .................. 10 2005 006 343

(51) Int. Cl.
*G11C 8/00* (2006.01)

(52) U.S. Cl. ................. 365/233; 365/226; 365/205; 365/207

(58) Field of Classification Search ................ 365/233, 365/226, 205, 207, 201, 189.01

See application file for complete search history.

(56) References Cited

U.S. PATENT DOCUMENTS

| 6,377,512 B1* | 4/2002 | Hamamoto et al. ......... 365/233 |
| 2004/0169524 A1 | 9/2004 | Maesaki et al. |
| 2004/0184344 A1 | 9/2004 | Saitoh et al. |

\* cited by examiner

*Primary Examiner*—David Lam
(74) *Attorney, Agent, or Firm*—Edell, Shapiro & Finnan, LLC

(57) ABSTRACT

An integrated semiconductor memory device includes a first input amplifier which, compared with a second input amplifier, has a lower sensitivity with regard to level fluctuations of its respective input signal. A control circuit drives a controllable switch in such a way that when a noisy clock signal is applied to the integrated semiconductor memory device, the less sensitive input amplifier is used for generating an internal clock signal. If, by contrast, a lower-noise clock signal is applied to the integrated semiconductor memory device, the control circuit drives the controllable switch in such a way that the more sensitive input amplifier is used for generating the internal clock signal. The changeover of the controllable switch is effected after evaluation of a bit sequence applied to a further input terminal of the integrated semiconductor memory device.

18 Claims, 5 Drawing Sheets

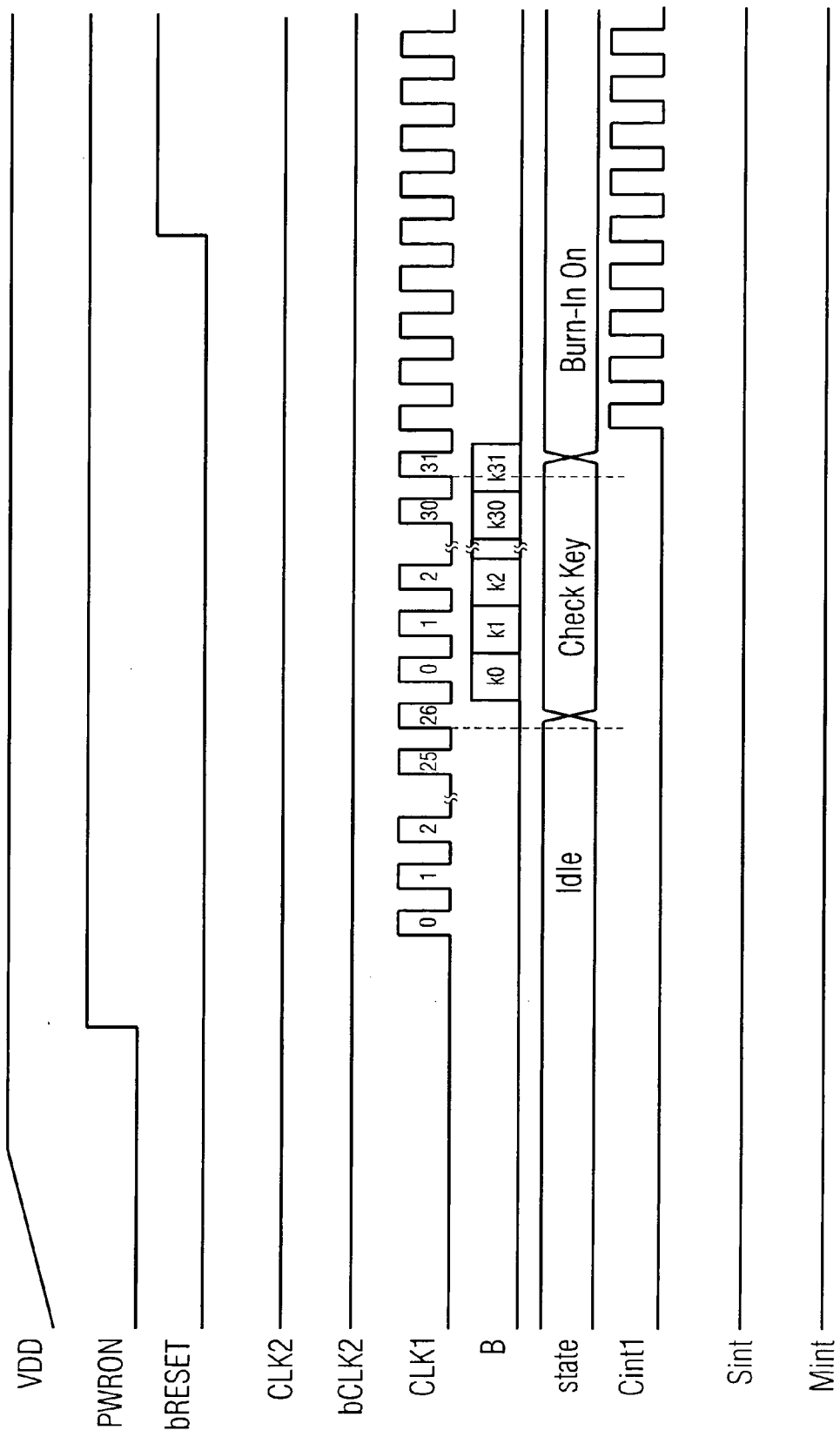

INTEGRATED SEMICONDUCTOR MEMORY WITH CLOCK-SYNCHRONOUS ACCESS CONTROL

CROSS REFERENCE TO RELATED APPLICATIONS

This application claims priority under 35 USC §119 to German Application No. DE 102005006343.8, filed on Feb. 11, 2005, and titled "Integrated Semiconductor Memory With Clock-Synchronous Access Control," the entire contents of which are hereby incorporated by reference.

Field of the Invention

The present invention relates to an integrated semiconductor memory device including a first and a second input amplifier for amplifying a level of an input signal, the second input amplifier being more sensitive than the first input amplifier with regard to level fluctuations of the input signal.

BACKGROUND

FIG. 1 shows an integrated semiconductor memory device 100 designed, for example as a DRAM (dynamic random access memory) semiconductor memory. The integrated semiconductor memory device includes a memory cell array 10, in which DRAM memory cells SZ are arranged in matrix-type fashion along word lines WL and bit lines BL. A DRAM memory cell includes a selection transistor AT and a storage capacitor SC. In the event of a read or write access to the memory cell SZ, a corresponding control potential that switches the selection transistor AT into the on state is fed in onto the word line connected to the memory cell. As a result, the storage capacitor is connected to the bit line BL in low-resistance fashion via the turned-on path of the selection transistor.

In a write access operation, a datum D present at a data terminal DQ is stored in the memory cell SZ by a high or low voltage potential being fed in onto the bit line BL connected to the memory cell from a sense amplifier (not illustrated in FIG. 1). Consequently, a high or low charge level is stored on the storage capacitor SC in a manner dependent on the datum present at the data terminal DQ.

In the event of a read access, the storage capacitor is discharged via the turned-on selection transistor, so that a potential increase or potential decrease arises on the bit line BL. The potential shift on the bit line is assessed by the sense amplifier connected to the bit line and the datum D is correspondingly output with a high or low voltage level to the data terminal DQ.

For the selection of a memory cell within a memory cell array constructed in rows and columns, an address ADS is applied to an address terminal A30. The address is buffer-stored in an address register 30, which includes an address part X for selecting a word line of the memory cell array and an address part Y for selecting a bit line of the memory cell array. The memory cell connected to the crossover point of the addressed word line and the addressed bit line can thereby be selected for the read or write access.

A control unit 20 serves for controlling read and write accesses. The control unit 20 includes a supply terminal V1 for application of a supply voltage VDD and a reference terminal V2 for application of a reference voltage VSS. For controlling the read and write accesses, it has an input terminal E25 for application of a chip select signal bCS, a control terminal S20a for application of a row select signal bRAS, a control terminal S20b for application of a column select signal bCAS and a control terminal S20c for application of a write signal bWE. Read and write accesses to memory cells of the memory cell array are effected synchronously with the profile of a clock signal.

FIG. 2 shows a write and read access to a selected memory cell, the write and read access proceeding synchronously with the profile of external clock signals CLK2 and bCLK2. In order to activate a write access, an activation signal ACT is applied to the integrated semiconductor memory device in the clock period 1. The activation signal being formed from a state change of the chip select signal bCS and of the row select signal bRAS. As a result of the activation signal ACT, a word line WL of the memory cell array 10 that is selected via an address component X is driven by the control unit 20 with a control voltage in such a way that the selection transistors of the memory cells which are arranged along the selected word line are turned on. In the subsequent clock period 2, the write command WRITE is applied to the integrated semiconductor memory device, the write command including a state change of the chip select signal bCS, of the column select signal bCAS and of the write signal bWE. As a result, a bit line is selected from the selected memory cells along the selected word line, the bit line being connected to a sense amplifier (not illustrated in FIG. 1).

Via the data terminal DQ which is likewise connected to the sense amplifier, the datum D can thus be written with a high or low voltage level to the selected memory cell. FIG. 2 shows the application of a data signal to the data terminal DQ in the clock period 3.

After the write access, a precharge command PRE is applied to the control unit 20 in the clock period 6. The precharge command PRE includes a state change of the chip select signal bCS, of the row select signal bRAS and of the write signal bWE. The precharge command brings about a precharging of all the bit lines of the memory cell array to a common equalized voltage, so that a uniform potential state prevails on all the bit lines of the memory cell array. A subsequent read and write access thus cannot be corrupted by a residual voltage that is possibly present on the bit lines.

For the read access to the memory cell SZ, the activation signal ACT is once again applied to the integrated semiconductor memory device, the activation signal turning on the selection transistors of the memory cells which are arranged along the selected word line. In order to select one of the memory cells along the selected word line, the read command READ is applied to the integrated semiconductor memory device in the clock period 8. The read command READ is formed from a state change of the chip select signal bCS and of the column select signal bCAS. The bit line connected to the selected memory cell is thereupon connected to the connected sense amplifier. The sense amplifier amplifies a potential change established on the bit line connected to the selected memory cell as a result of the discharging of the storage capacitor SC, and generates the datum D with a high or low logic level at the data output DQ according to the charge state of the storage capacitor.

The circuit components of the integrated semiconductor memory device that are provided for the read and write accesses, such as row and column decoders, for example, are generally not driven directly by the external clock signal. Instead, the control unit 20 generates an internal clock signal Cint2 at an internal terminal A20a from the clock signal component CLK2 applied to an input terminal E22a and the complementary clock signal component bCLK2 applied to an input terminal E22b. In the case of an integrated semiconductor memory device with clock-synchronous access control, all the circuit components of the integrated semiconductor memory device are then operated synchronously with the profile of the internal clock signal Cint2.

The generation of the internal clock signal Cint2 is explained below with reference to FIG. 3. Within an input amplifier of the control unit 20, a level of the external clock signal CLK2 is compared with a level of the clock signal bCLK2 complementary thereto. The input amplifier is formed as a differential amplifier and generates at points of intersection between the clock signal CLK2 and the complementary clock signal bCLK2, alternately a falling or rising signal edge of the internal clock signal Cint2. FIG. 3 shows the profile of the internal clock signal Cint2 in the ideal case where the control unit 20 is driven with noise-free external clock signals CLK2 and bCLK2.

In comparison with FIG. 3, FIG. 4 shows the real signal profile of an external clock signal CLK 1 provided, for example, by a tester during a functional test of the integrated semiconductor memory device. In contrast to the ideal clock signal CLK2, an interference amplitude is superposed on the real clock signal CLK1, so that fluctuating voltage levels of the real clock signal occur. During a functional test of the integrated semiconductor memory device, the clock signal CLK1 is applied to the input terminal E22a and a clock signal bCLK 1 with a constant level is applied to the input terminal E22b. Since the input amplifier connected to the input terminals E22a and E22b is generally formed as a fast input amplifier having a high limiting frequency, voltage peaks lying above or below the constant level of the clock signal bCLK1 arise particularly during the transition of the clock signal CLK1 from a low to a high level or from a high level to a low level. As a consequence of this, the input amplifier, which is designed for high-frequency level fluctuations of the input signals, as shown in FIG. 4, generates high-frequency level fluctuations of the internal clock signal Cint1. Due to the fast input amplifiers, it can thus happen, particularly when the integrated semiconductor memory device is driven with the clock signals of a tester on which interference signals are superimposed, that an interference signal on a clock line is assessed as a clock pulse and the chip can therefore no longer operate correctly. The risk increases all the more, the higher the limiting frequency of the input amplifier is or the faster and more sensitively the input amplifier reacts to the level fluctuations of its input signal.

One of the functional tests of an integrated semiconductor memory device is the so-called bum-in test, during which the chip is operated at elevated temperature for several hours. In this case, the chip has already been fully incorporated in a housing. The burn-in test is intended to sort out early failures in the life cycle of integrated semiconductor memories. Since the test runs for a long time, many chips are operated in parallel with testers that are as cost-effective as possible. In contrast to a normal operating mode of the integrated semiconductor memory device, in which a graphics DRAM on a motherboard of a computer is driven, for example, with operating frequencies of 800 MHz, the testers used have only an operating frequency of 5 to 10 MHz and slow signal edges of up to 50 ns. Furthermore, the dense placement of the semiconductor memories on a test board during the functional test often gives rise to increased reverse voltages of up to 100 mvolts on the signal lines.

SUMMARY OF THE INVENTION

The present invention provides an integrated semiconductor memory device which, in driving with an external clock signal, can be operated reliably clock-synchronously with the applied external clock signal. The present invention further provides a method by which an integrated semiconductor memory device, in driving with an external clock signal, can be operated reliably clock-synchronously with the profile of the external clock signal.

In accordance with the present invention, an integrated semiconductor memory device with clock-synchronous access control comprises an internal terminal that generates an internal clock signal, and read and write accesses are controlled clock-synchronously with the internal clock signal. The integrated semiconductor memory device further comprises a first input amplifier to amplify a level of a first input signal including an input terminal to apply the first input signal and an output terminal to generate a first output signal, and at least a second input amplifier to amplify a level of a second input signal including an input terminal to apply the second input signal and an output terminal to generate a second output signal. The first input amplifier is designed in such a way that it generates a level of the first output signal in a manner dependent on the level of the first input signal. The second input amplifier is designed in such a way that it generates a level of the second output signal in a manner dependent on the level of the second input signal. The first input amplifier amplifies the first input signal up to a first limiting frequency and the second input amplifier amplifies the second input signal up to a second limiting frequency, the first limiting frequency being lower than the second limiting frequency. The integrated semiconductor memory device furthermore comprises a controllable switch via which the output terminal of the first input amplifier or the output terminal of the second input amplifier can be connected to the internal terminal that generates the internal clock signal. The output terminal of the second input amplifier is connected via the controllable switch to the internal terminal that generates the internal clock signal if the input terminal of the second input amplifier is driven by the second input signal, and otherwise the output terminal of the first input amplifier is connected via the controllable switch to the internal terminal that generates the internal clock signal.

In accordance with an embodiment of the integrated semiconductor memory device of the invention, in the case of the second input amplifier, a first input terminal is provided to apply a first clock signal and a second input terminal is provided to apply a second clock signal. The first and second clock signals in each case have a first and second level. Furthermore, the output terminal of the second input amplifier is connected via the controllable switch to the internal terminal that generates the internal clock signal if the first input terminal of the second input amplifier is driven by the first level of the first clock signal or if the second input terminal of the second input amplifier is driven by the first level of the second clock signal.

In accordance with another embodiment of the integrated semiconductor memory device of the invention, the integrated semiconductor memory device includes a control circuit to control the controllable switch into a first or second switch position. The second input amplifier is connected to the control circuit on the output side. The controllable switch is designed in such a way that, in a first switch position it connects the internal terminal that generates the internal clock signal to the output terminal of the first input amplifier if it is driven by the control circuit with a first state of the control signal that controls the controllable switch. The controllable switch is designed in such a way that, in a second switch position, it connects the internal terminal that generates the internal clock signal to the output terminal of the second input amplifier if it is driven by the control circuit with a second state of the control signal that controls the controllable switch.

According to a further embodiment of the invention, the integrated semiconductor memory device includes a third input amplifier to amplify a level of a third input signal including an input terminal to apply the third input signal. The control circuit is connected to the first input amplifier and to the third input amplifier on the input side. The control circuit is designed in such a way that it drives the controllable switch with the first state of the control signal that controls the controllable switch if the input terminal of the first input amplifier is driven by a number of clock cycles of the first input signal and the input terminal of the third input amplifier is subsequently driven with a bit sequence.

The control circuit can be designed in such a way that it evaluates the bit sequence fed to it from the third input amplifier by comparing the bit sequence fed with a stored bit sequence and, in the case where the bit sequence fed matches the stored bit sequence, driving the controllable switch with the first state of the control signal that controls the controllable switch.

In accordance with another embodiment of the integrated semiconductor memory device of the invention, memory cells are provided, in each of which a memory state can be stored. The integrated semiconductor memory device furthermore comprises a supply terminal to apply a supply voltage, a detector circuit to detect a level of the supply voltage, a fourth input amplifier to amplify a level of a reset signal including an input terminal to apply the reset signal with an active or inactive state. The integrated semiconductor memory device is put into an initial state by configuration settings being reset if the reset signal has the active state. The control circuit is connected to the fourth input amplifier and to the detector circuit on the input side, on which the control circuit is designed in such a way that it evaluates the bit sequence if the detector circuit detects a desired level of the supply voltage and the reset signal has the active state.

In accordance with a further embodiment of the invention, the integrated semiconductor memory device comprises a first control input to apply a first control signal and a second control terminal to apply a second control signal. In a mirror operating mode of the integrated semiconductor memory device, the first control signal is present at the second control terminal and the second control signal is present at the first control terminal. The control circuit is designed in such a way that, for a read and write access to one of the memory cells in the mirror operating mode, it evaluates the first control signal at the second control terminal and the second control signal at the first control terminal if the detector circuit has detected a desired level of the supply voltage and the reset signal has the inactive state and the third input signal with an active state is present at the third input amplifier.

The integrated semiconductor memory device of the invention can further include an output terminal to output states of the control signals and a register to store the states of the control signals. The control circuit is designed in such a way that it buffer-stores states of the control signals that are present at the control inputs in the register and, at the output terminal that outputs control signals, outputs the states of the control signals that are buffer-stored in the register if the detector circuit has detected the desired level of the supply voltage and the reset signal has the inactive state and the first input signal with an active state is present at the first input amplifier.

The integrated semiconductor memory device of the invention may also include a fifth input amplifier to amplify a level of a chip select signal including an input terminal to apply the chip select signal. The integrated semiconductor memory device is selected for the read and write access if the chip select signal changes from an inactive state to an active state. The control circuit is designed in such a way that it buffer-stores the states of the control signals that are present at the control inputs in the register synchronously with a clock signal present at the input terminal of the fifth input amplifier if the detector circuit has detected the desired level of the supply voltage and the reset signal has the inactive state and the first input signal with the active state is present at the first input amplifier.

In accordance with another embodiment of the invention, the control circuit is designed in such a way that it interrupts the evaluation of the bit sequence fed to it from the third input amplifier and drives the controllable switch with the second state of the control signal that controls the controllable switch if the input terminal for application of the second input signal is driven by the second input signal or the reset signal has the inactive state or if the chip select signal changes from the inactive state to the active state.

Furthermore, the control circuit may be designed in such a way that it changes over the controllable switch from the first switch position into the second switch position if the input terminal of the second input amplifier is driven by the second input signal.

According to a further embodiment of the integrated semiconductor memory device, the control circuit is designed in such a way that it drives the controllable switch with the second state of the control signal that controls the controllable switch if the input terminal of the second input amplifier is driven by the second input signal or the reset signal has the inactive state or if the chip select signal changes from the inactive state to the active state or if the input terminal of the third input amplifier is driven by the active state of the third input signal.

A method for operating an integrated semiconductor memory device comprises providing an integrated semiconductor memory device that includes memory cells, in each of which a memory state can be stored. The method further comprises providing an internal terminal that generates an internal clock signal, read and write accesses to one of the memory cells being effected synchronously with the profile of the internal clock signal. A first input amplifier is provided to amplify a level of a first input signal including an input terminal to apply the first input signal and an output terminal to generate a first output signal, a second input amplifier is provided to amplify a level of a second input signal including an input terminal to apply the second input signal and an output terminal to generate a second output signal, a third input amplifier is provided to amplify a level of a third input signal including an input terminal to apply the third input signal and an output terminal to generate a third output signal, where the input amplifiers are configured to generate their respective output signals with a first or second level in a manner dependent on a level of their respective input signals, the first input amplifier amplifies the first input signal up to a first limiting frequency and the second input amplifier amplifies the second input signal up to a second limiting frequency, the first limiting frequency being lower than the second limiting frequency. A controllable switch is provided via which optionally the first input amplifier can be connected on the output side to the internal terminal that generates the internal clock signal or the second input amplifier can be connected on the output side to the internal terminal that generates the internal clock signal. A fourth input amplifier is also provided to amplify a level of a reset signal and an input terminal to apply the reset signal, where the integrated semiconductor memory device is configured to carry out read and write access if the reset signal has an inactive state, and the integrated semiconductor memory device is put into an initial state by the configuration settings being reset if the reset signal has an active state. The reset signal is applied with the inactive state to the input terminal of the fourth input amplifier. A number of clock periods of a clock signal are subsequently applied to the input terminal of the first input amplifier. A bit sequence is then applied to the input terminal of the third input amplifier. The bit sequence is evaluated by the control circuit by being compared with a stored bit sequence. The controllable switch is switched into a first switch position, in which the first input amplifier is connected on the output side via the controllable switch to the internal terminal that generates the internal clock signal, if the bit sequence matches the stored bit sequence. The controllable switch is switched into a second switch position, in which the second input amplifier is connected on the output side via the controllable switch to the internal terminal that generates the internal clock signal, if the second input signal is applied to the input terminal of the second input amplifier.

The integrated semiconductor memory device can be provided with control inputs, to which a respective control signal for external control of the read and write accesses is applied, and also a supply terminal to apply a supply voltage. The integrated semiconductor memory device is operated in a normal operating mode, in which, for carrying out a read and write access to one of the memory cells, a first one of the control signals is applied to a first one of the control terminals and a second one of the control signals is applied to a second one of the control terminals if the supply voltage with a desired level is present at the supply terminal and the reset signal has the inactive state and the third input signal with an inactive state is present at the third input amplifier. The integrated semiconductor memory device is operated in a mirror operating mode, in which, for carrying out a read and write access to one of the memory cells, the first one of the control signals is applied to the second one of the control terminals and the second one of the control signals is applied to the first one of the control terminals, if the supply voltage with a desired level is present at the supply terminal and the reset signal has the inactive state and the third input signal with an active state is present at the third input amplifier.

The integrated semiconductor memory device can further be provided with an output terminal to generate states of the control signals and a register to store the states of the control signals. The control signals are applied to a respective one of the control terminals of the integrated semiconductor memory device. The states of the control signals are buffer-stored in the register if the supply voltage with the desired level is present at the supply terminal and the reset signal has the inactive state and the first input signal with an active state is present at the first input amplifier. Afterward, the states of the control signals that are buffer-stored in the register are output at the output terminal that generates the states of the control signals.

In another embodiment of the method for operating the integrated semiconductor memory device, after switching the controllable switch into the first switch position, the reset signal is applied with the inactive state, and the controllable switch furthermore remains in the first switch position until the second input amplifier is driven with the second input signal.

In accordance with a further embodiment of the method for operating the integrated semiconductor memory device, a fifth input amplifier is provided to amplify a level of a chip select signal for selection of the integrated semiconductor memory device for a read and write access if the chip select signal changes from an inactive state into an active state, including an input terminal to apply the chip select signal. The evaluation of the bit sequence is interrupted if the second input amplifier is driven with the second input signal or if the fourth input amplifier is driven with the inactive state of the fourth input signal or if the fifth input amplifier is driven by a state change of the chip select signal from the inactive state into the active state. After the interruption of the evaluation of the bit sequence, the controllable switch is switched into the second switch position, in which the second input amplifier is connected on the output side via the controllable switch to the internal terminal that generates the internal clock signal.

The controllable switch can be switched into the second switch position, in which the second input amplifier is connected on the output side via the controllable switch to the internal terminal that generates the internal clock signal, if the second input amplifier is driven with the second input signal or if the third input amplifier is driven by the active state of the third input signal or if the fourth input amplifier is driven with the inactive state of the reset signal or if the fifth input amplifier is driven by a state change of the chip select signal from the inactive state into the active state.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 7 shows signal profiles of control signals of the integrated semiconductor memory device when switching on a burn-in operating mode of the integrated semiconductor memory device in accordance with the present invention.

DETAILED DESCRIPTION

Figure 1:
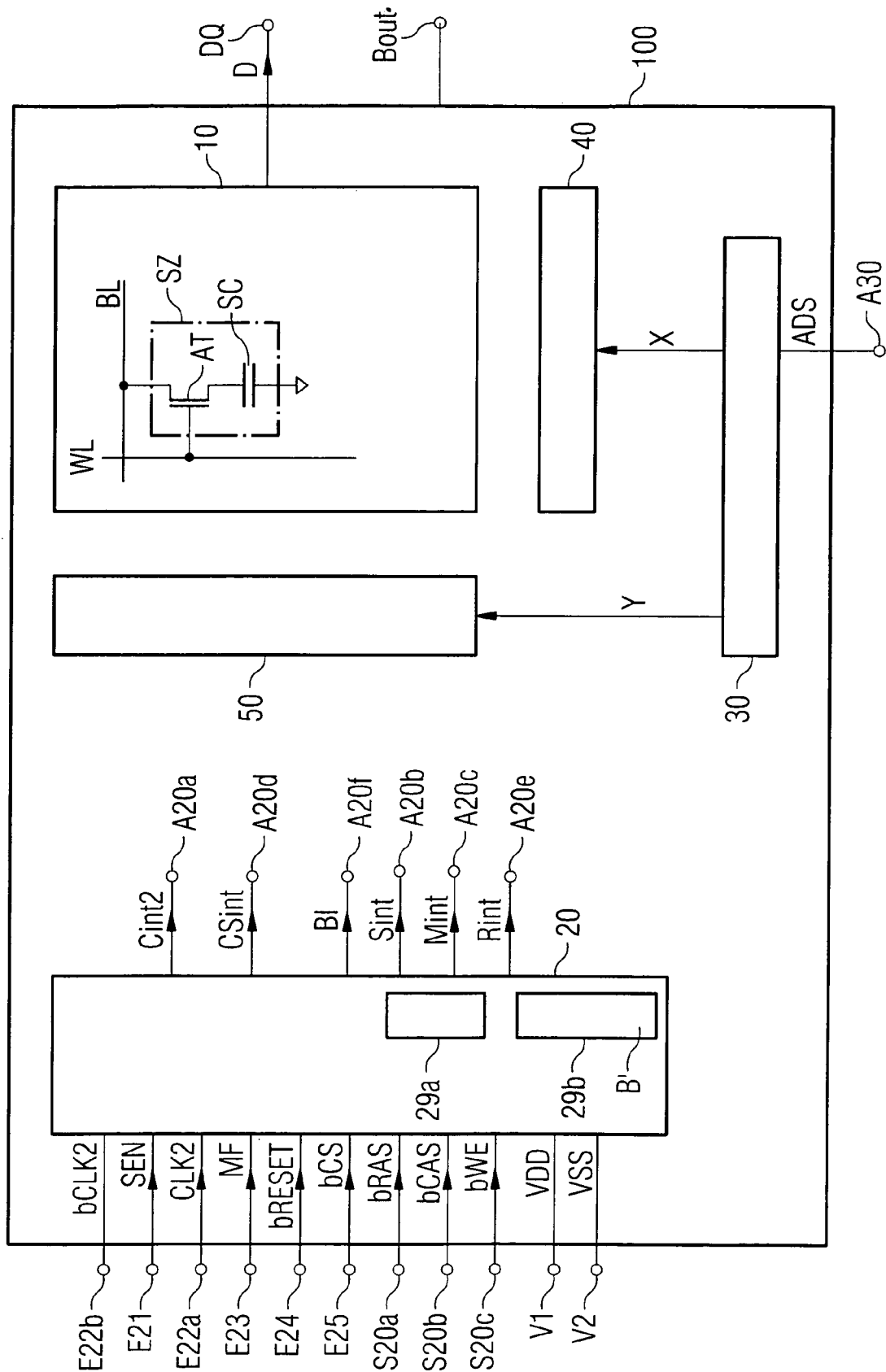
FIG. 1 schematically depicts an integrated semiconductor memory device for the clock-synchronous control of read and write accesses in accordance with the present invention.
Figure 2:
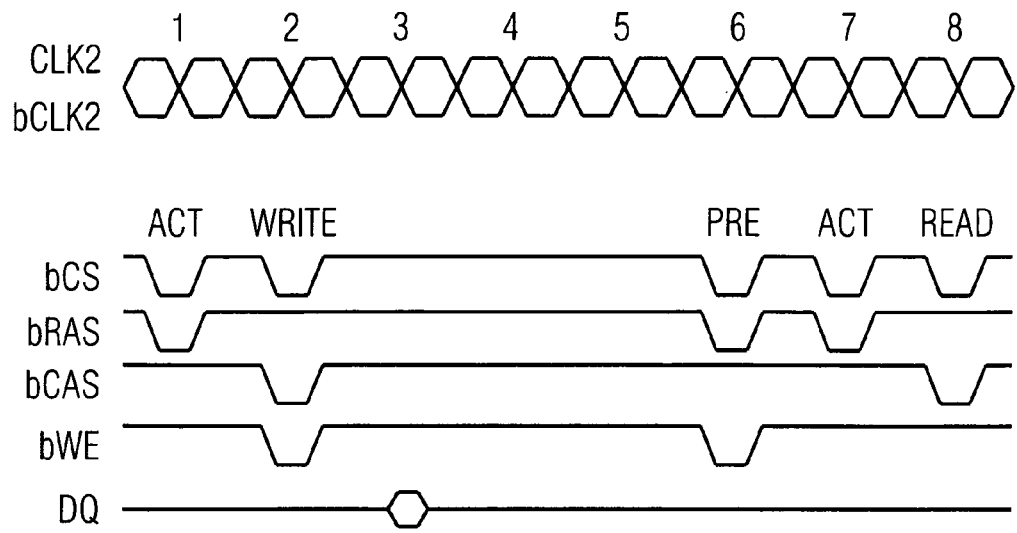
FIG. 2 depicts signal profiles of control signals during a read and write access.
Figure 3:
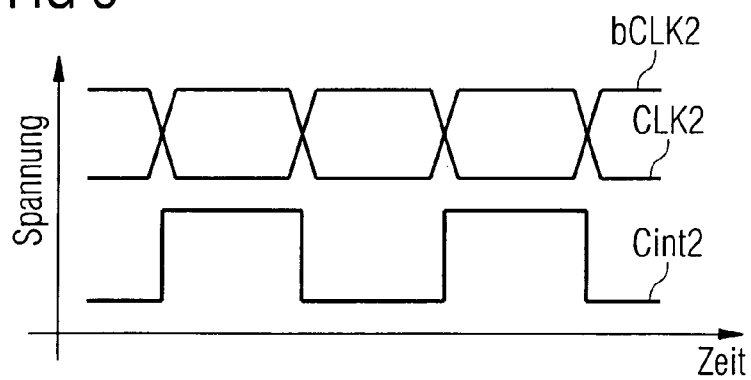
FIG. 3 depicts the profile of a noise-free external clock signal with the profile of an internal clock signal resulting therefrom.

In general, the input terminals of the control unit 20 which are illustrated in FIG. 1 are connected to input amplifiers which differ with regard to their sensitivity or their speed. A fast input amplifier or an input amplifier having a high sensitivity has a high limiting frequency. It can thus accept high-frequency level fluctuations of an input signal. A slow input amplifier or an input amplifier having a low limiting frequency reacts only to low-frequency level fluctuations on an input signal up to a low limiting frequency.

Figure 5:
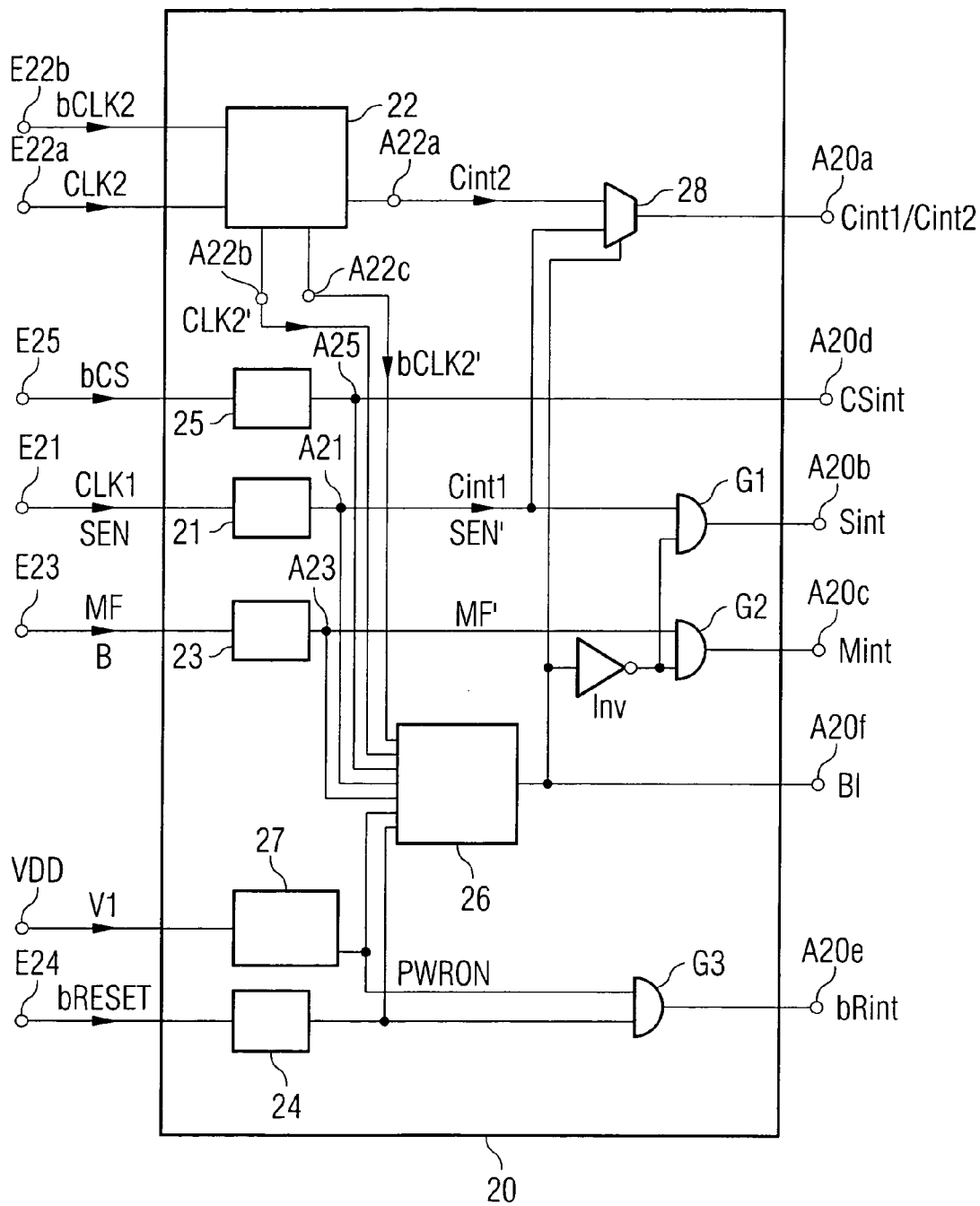
FIG. 5 schematically depicts circuit components of a control circuit of the integrated semiconductor memory device in accordance with the present invention.

FIG. 5 shows an enlarged illustration of the construction of the control unit 20. The control unit 20 includes a slow input amplifier 21 having a low limiting frequency, which is connected to an input terminal E21 for application of an input signal SEN. The input amplifier 21 generates an output signal Cint1 at an output terminal A21 if it is driven by an external clock signal CLK1. The output signal Cint1 is fed to an AND gate G1, a control circuit 26 and a controllable switch 28. In a first switch position of the controllable switch 28, the output terminal A21 is connected to an internal terminal A20a for generating the internal clock signal.

The input terminal E21 is preferably the so-called scan enable pin of the integrated semiconductor memory device. If the input signal SEN with an active state is applied to the scan enable pin, the chip can be operated in a so-called scan mode. In the scan mode, the levels of the input and control signals that are present at the input terminals of the control unit 20 of FIG. 1 are buffer-stored in a register 29a and read out again at a so-called scan out pin Bout. It is thereby possible to test, for example, whether the integrated semiconductor memory device is driven by signal levels, such as signal levels of a memory controller in a manner free of errors and has thus been soldered on a circuit board without any errors.

If the input signal SEN with the active state is applied to the input terminal E21, the input amplifier 21 generates at its output terminal A21 an output signal SEN' having the logic "1" level which drives both the AND gate G1 and the control circuit 26. Consequently, the control circuit 26 generates a control signal BI having a logic "0" level on the output side. This level is altered into a logic "1" level by an inverter Inv. AND gate G1 thus generates at an internal terminal A20b the control signal Sint with the active state, which identifies the operation of the integrated semiconductor memory device in the scan mode.

In the normal operating mode of the integrated semiconductor memory device, in which read and write accesses to the memory cells are effected, the input signal SEN with an inactive level, for example, permanently with the logic "0" level, is present at the scan enable pin. As a result, the control signal Sint with the inactive state is generated at the output terminal A20b.

The control unit furthermore includes a fast input amplifier 22 having a high limiting frequency. If the external clock signal CLK2 is applied to the input terminal E22a and the external clock signal bCLK2 is applied to the input terminal E22b, the input amplifier 22 generates the internal clock signal Cint2 at its output terminal A22a and feeds it to the controllable switch 28. The input amplifier 22 compares the profile of the external clock signal CLK2 with the profile of the external clock signal bCLK2. Rising and falling edges of the internal clock signal Cint2 are generated at a point of intersection between the two external clock signals. At the same time, the input amplifier 22 generates an amplified clock signal CLK2' and an amplified complementary clock signal bCLK2' at an output terminal A22b, which are fed in each case to the control circuit 26.

If the integrated semiconductor memory device is operated in an application, for example on a motherboard of a computer, it is driven by the clock signals of a memory controller at the input terminals E22a and E22b. Since the external clock signals made available by the memory controller lie in a high frequency range for which the input amplifier 22 is designed, undesired level fluctuations of the output signals Cint2 do not occur in the region of the points of intersection of the external clock signals. Therefore, when the integrated semiconductor memory device is driven with the clock signals of a memory controller, the input amplifier 22 can be used for generating the internal clock signal. In the normal operating mode of the integrated semiconductor memory device, if the integrated semiconductor memory device is driven by a memory controller, the controllable switch 28 is therefore switched into a second switch position, in which the internal terminal A20a for generating the internal clock signal is connected to the output terminal A22a of the input amplifier 22.

A slow input amplifier 23, which is formed as an input amplifier having a low limiting frequency, is connected to an input terminal E23 for application of an input signal MF. The input terminal E23 is preferably formed as a mirror function pin. The input amplifier 23 generates the control signal MF' at its output terminal A23 and feeds it to the control circuit 26 and an AND gate G2. Through application of the input signal MF with an active state, the integrated semiconductor memory device can be operated in a mirror operating mode. While in the normal operating mode, as illustrated in FIG. 1, the control terminal S20a serves for application of the row select signal bRAS and the control terminal S20b serves for application of the column select signal bCAS, in the mirror operating mode the control terminal S20a is used for application of the column select signal bCAS and the control terminal S20b is used for application of the row select signal bRAS. The integrated semiconductor memory device is operated in the mirror operating mode if it is positioned on the underside of a printed circuit board instead of on the top side of the printed circuit board. All the external input and control terminals are driven in mirror-inverted fashion in this case. If the input signal MF has the active state, in the input amplifier 23 generates the control signal MF' having a logic "1" level at its output terminal A23. Driving with the logic "1" level of the input amplifier 23 has the consequence that the control circuit 26 generates the control signal BI having the logic "0" level on the output side. Since the control signal BI is inverted by the inverter Inv, the AND gate G2 is driven with the logic "1" level so that a control signal Mint having a logic "1" level is generated at the internal terminal A20c.

Furthermore, the control unit 20 has an input terminal E24 for application of a reset signal bRESET which is connected to an input amplifier 24 having a low limiting frequency. The input amplifier 24 is connected on the output side to an AND gate G3 and to the control circuit 26. Through the application of an inactive state of the reset signal bRESET the integrated semiconductor memory device can be activated for read and write accesses. Through the application of an active state of the reset signal bRESET, the control circuit is reset into its initial state. In the initial state, all the memory banks are closed and configuration states such as burst lengths, for example, which are defined by entries in a mode register are reset.

Furthermore, FIG. 5 shows the input terminal E25 for application of the chip select signal bCS which is fed to an input amplifier 25 having a high sensitivity. The input amplifier 25 amplifies the chip select signal bCS and feeds it via an output terminal A25 as internal chip select signal CSint to the control circuit 26 and to an internal terminal A20d from which it is fed to further circuit components of the integrated semiconductor memory device.

The control unit 20 is connected to a supply terminal V1 for application of a supply voltage VDD. The terminal V1 is connected to a voltage detector circuit 27, which generates a control signal PWRON on the output side. The control signal PWRON is fed from the voltage detector circuit 27 to the control circuit 26 and also to the AND gate G3. If a specified supply voltage level is present at the supply terminal V1, the voltage detector 27 generates the control signal PWRON in an active state, that is to say for example the logic "1" level on the output side. In the case of an active state of the reset signal bRESET or an inactive state of the control signal PWRON, the control signal bRint with the active state is generated at the internal terminal A20e on account of which the control unit is reset into its basic state.

In contrast to the normal operating mode, in which the high-frequency external clock signal components CLK2 and bCLK2 are fed from a memory controller to the input terminals E22a and E22b and the controllable switch is in the second switch position, so that the internal clock signal Cint2 is generated by the input amplifier 22, according to the invention, in a test operating mode of the integrated semiconductor memory device the low-frequency clock signal CLK1 of a tester is applied to the input terminal E21 and thus evaluated by the input amplifier 21. The input amplifier 21 is formed as an inverter, by way of example. The latter requires only a single input signal CLK1 for its operation. The input amplifier 21 has an internal switching threshold. In the case where the level of the clock signal CLK1 intersects the level of the switching threshold, the input amplifier 21 generates rising or falling signal edges of the internal clock signal Cint1.

Figure 4:
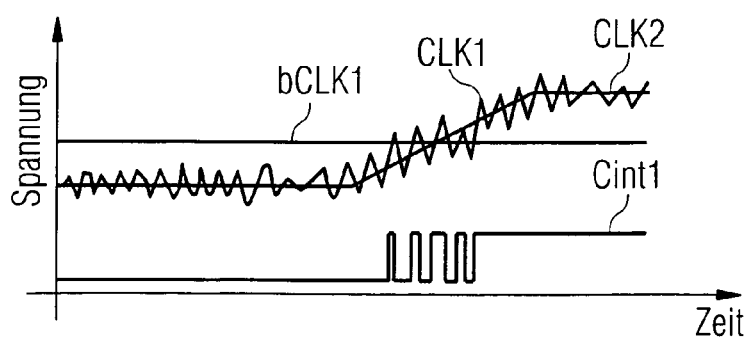
FIG. 4 depicts the profile of a noisy external clock signal with the profile of an internal clock signal resulting therefrom in accordance with the prior art.

The controllable switch 28 is driven by the control circuit by the logical "1" level of the control signal V1, so that it is switched into the first switch position. Consequently, the internal clock signal Cint1 is generated by the input amplifier 21 is generated at the internal terminal A20a. The generation of the internal clock signal by the input amplifier 21 has the advantage that a slow input amplifier adapted to low frequencies is used for the low-frequency clock signal in the range of 5–10 MHz. Since the input amplifier 21 has a low limiting frequency it is possible, particularly in the transition region of the external clock signal, when changing from a low level to a high level, to avoid high-frequency level fluctuations of the internal clock signal, to be precise particularly when an interference signal, as illustrated in FIG. 4, is superposed on the signal profile.

If the control unit 20 is driven by the external clock signal component CLK2 at the input terminal E22a or by the clock signal component bCLK2 complementary thereto at the input terminal E22b or if the reset signal bRESET is applied to the input terminal E24 with the inactive state, or if the input signal MF is applied to the input terminal E23 with the active state, or if the chip select signal bCS is applied to the input terminal E25 with the active state, the control circuit 26 generates the control signal BI with the logic "0" level, so that the controllable switch 28 is controlled into the second switch position. The internal clock signal is then derived from the external clock signal components CLK2 and bCLK2 applied to the input terminals E22a and E22b.

Figure 6:
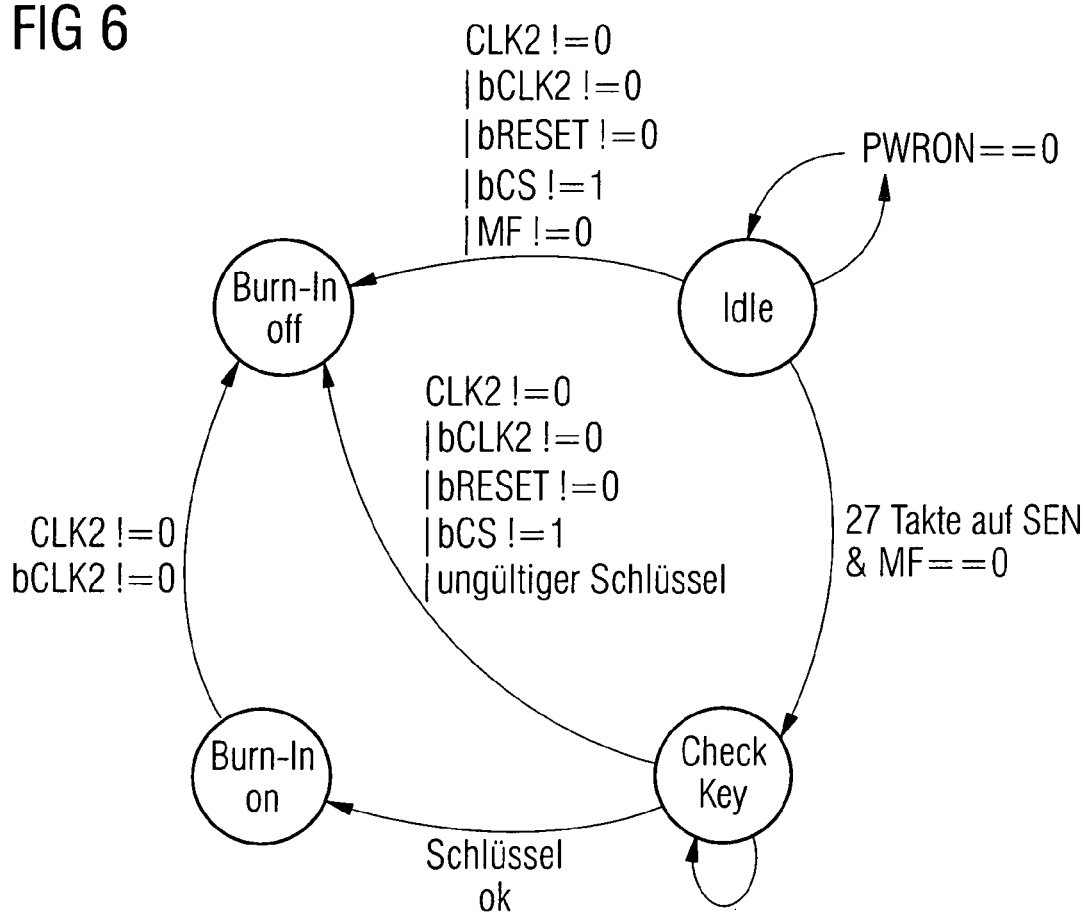
FIG. 6 shows a state diagram of the integrated semiconductor memory device for switching on or off a burn-in operating mode of the integrated semiconductor memory device in accordance with the present invention.

The functioning of the circuit components of FIG. 5 for changing over the controllable switch is explained below with reference to FIGS. 6 and 7. FIG. 7 shows the rising of the voltage level of the supply voltage VDD at the supply terminal V1 in the first signal row. If the specified voltage level of the supply voltage is present at the supply terminal V1, the voltage detector 27 generates a state change of the control signal PWRON from a low level to a high level on the output side. The reset signal bRESET remains in the active state in the meantime. The integrated semiconductor memory device is thus still inhibited for write and read accesses. Furthermore, no clock signals are applied to the input terminals E22a and E22b for application of the clock signal components CLK2 and bCLK2. Logic "0" levels are thus present here. Instead, the clock signal CLK1 of the tester is then applied to the input terminal E21.

The control circuit 26 controls the number of clock periods present at the input terminal E21 by implementing a binary counter of a register 29a. The register 29a is used as a counting register by the control circuit 26. The input signal MF with the logic "0" level is present at the input terminal E23 in the meantime. After a predefined number of clock periods have been applied to the input terminal E21, for example after 27 clock periods, a characteristic bit sequence B composed of 31 bits, by way of example, is applied to the input terminal E23. The bit sequence is evaluated synchronously with the profile of the clock signal at the input terminal E21 by the control circuit 26. The characteristic bit sequence B present at the input terminal E23 is read into the register 29a and compared with a bit sequence , B' stored in a register 29b. In the case where the bit sequence read in matches the stored bit sequence, the control circuit 26 generates, on the output side, the control signal BI with a logic "1" level for activating the burn-in operating mode. The logic "1" level of the control signal BI has the effect that the controllable switch 28 is controlled into the first switch position, so that the internal clock signal Cint1 is generated at the internal terminal A20a by the input amplifier 21. The burn-in operating mode is also maintained if the reset signal bRESET changes to the inactive state.

Defined write and read accesses to memory cells of the memory cell array 10 take place in the burn-in operating mode, these write and read accesses may be effected synchronously with the profile of the internal clock signal Cint1. Utilizing the AND gate G1 and the AND gate G2, the control signal Sint is generated at the internal terminal A20b and the control signal Mint is generated at the internal terminal A20c, with the logic "0" level.

If the reset signal bRESET is in an inactive state, the scan mode is switched on by the application of the active state of the input signal SEN to the input terminal E21. The control circuit 26 then generates the control signal BI with the logic "0" level, so that the control signal Sint with the logic "1" level, which identifies operation in the scan mode, is generated at the internal terminal A20b. As a result of the application of the input signal MF with the active state to the input terminal E23, the integrated semiconductor memory device is operated in the mirror operating mode. The control circuit 26 then generates the control signal BI with the logic "0" level so that the control signal Mint with the logic "1" level, which identifies the mirror operating mode, is generated at the internal terminal A20c.

The control circuit 26 is designed in such a way that it interrupts the burn-in operating mode, that is to say generates the control signal BI with a logic "0" level, if the clock signal component CLK2 is applied to the input terminal E22a or the clock signal component bCLK complementary thereto is applied to the input terminal E23b. Likewise, the evaluation of the bit sequence applied to the input terminal E23 is also interrupted, and the control signal BI with the logic "0" level is generated, if the clock signal component CLK2 is applied to the input terminal E22a or the clock signal component bCLK2 complementary thereto is applied to the input terminal E22b. Furthermore, the evaluation of the bit sequence at the input terminal E23 is interrupted if the reset signal bRESET changes from the-active state to the inactive state during the evaluation of the bit sequence. If the reset signal bRESET is in an inactive state, the scan mode is switched on by application of an active state of the input signal SEN, that is to say for example by the application of the logic "1" level to the input terminal E21, and the integrated semiconductor memory device is operated in the mirror operating mode by the application of an active state of the input signal MF, that is to say of the logic "1" to the input terminal E23. In order to unambiguously identify the switch-on of the burn-in operating mode, therefore, the reset signal bRESET must be in an active state during the evaluation of the bit sequence, since otherwise the clock signal at the input terminal E21 would activate the scan mode and the bit sequence at the input terminal E23 would activate the mirror operating mode.

Furthermore, it must be taken into account that the chip select signal bCS is used as clock signal in the scan mode. In order to prevent the chip in the scan mode from being switched into the burn-in operating mode, the chip select signal bCS must always be inactive during the detection of the bit sequence at the input terminal E23.

The circuit proposed thus takes account of the fact that the chip has already been incorporated in the housing if a low-frequency and often noisy clock signal is applied by a tester. Consequently, unlike what is generally customary, it is not possible to use additional test pads on the chip in order to switch the semiconductor memory into the burn-in operating mode. Consequently, only pins which are also available to a user can be used for switching on the burn-in operating mode. The circuit proposed and the method ensure a high degree of security that the semiconductor memory cannot be inadvertently switched into the burn-in operating mode in an application.

It is furthermore taken into account that the evaluation of the bit sequence for the activation of the burn-in operating mode cannot be effected synchronously with the profile of clock signals which are applied to the input amplifier 22, since unforeseeable clock pulses of the internal clock signal can otherwise occur. Through the evaluation of the low-frequency clock signal of the tester by means of an input amplifier having a low limiting frequency, the internal clock signal can be generated in a manner free of distortion and without undesirable level fluctuations.

It is furthermore taken into account that, unlike what is normally customary, it is possible to change from a normal operating state to a test operating state, such as, for example the burn-in operating mode, by applying a test mode key bit sequence to the integrated semiconductor memory device. The switch-on of a test mode by a test mode key bit sequence generally presupposes one or more accesses to a mode register of the integrated semiconductor memory device which is used for the configuration of the integrated semiconductor memory device. A functional clock identification from an external clock signal with the clock signal components CLK2 and /bCLK2 which are fed to the input terminals E22a and E22b is necessary, however, for accesses to the mode register.

In the normal operating mode, the controllable switch 28 is in the second switch position, so that the clock signal Cint2 generated at the internal terminal A2/a is derived from the external clock signal components CLK2 and bCLK2 at the input terminals E22a and E22b. Since, in the normal operating mode, for example when using the integrated semiconductor memory device in a computer application, different voltage levels can be attained in an unforeseeable manner as a result of voltage fluctuations at the input terminals, a changeover of the controllable switch 28 into the first switch position by defined voltage levels which are applied to the input terminals E21, . . . E25 or the control terminals S20a, S20b and S20c is ruled out. Therefore, the controllable switch 28 is switched into the first switch position only when the integrated semiconductor memory device is driven by the active state of the reset signal bRESET and a specific bit sequence is applied to the input terminal E23 after a defined number of clock pulses at the input terminal E21. The method of the invention thus prevents the integrated semiconductor memory device from being switched form the normal operating mode into the burn-in operating mode, even if the chip is operated with slight specification violations at some input and control terminals.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of Reference Symbols:
10 Memory cell array
20 Control unit
21 , . . . , 25 Input amplifier
26 Control circuit
27 Voltage detector
28 Controllable switch
29 Register
30 Address register
40 Column decoder
50 Row decoder
100 Integrated semiconductor memory device
A Output terminal
B Bit sequence
bCAS Column select signal
bCS Chip select signal
BI Control signal for switching on the burn-in operating mode
bRAS Row select signal
bRESET Reset signal
bWE Write signal
Cint1,2 Internal clock signal
CLK External clock signal
D Datum
DQ Data terminal
E Input terminal
MF Input signal for mirror operating mode
PWRON Signal for detecting the level of operating voltages
SEN Input signal for scan mode
VDD Supply voltage
Vref Reference voltage
VSS Reference Voltage
X, Y Address components

What is claimed is:

1. An integrated semiconductor memory device with clock-synchronous access control, comprising:
   an internal terminal that generates an internal clock signal, wherein read and write accesses are controlled clock-synchronously with the internal clock signal;
   a first input amplifier to amplify a level of a first input signal, the first input amplifier including an input terminal to apply the first input signal and an output terminal to generate a first output signal;
   a second input amplifier to amplify a level of a second input signal, the second input amplifier including an input terminal to apply the second input signal and an output terminal to generate a second output signal, wherein the first input amplifier is configured to generate a level of the first output signal in a manner dependent on the level of the first input signal, the second input amplifier is configured to generate a level of the second output signal in a manner dependent on the level of the second input signal, and the first input amplifier is configured to amplify the first input signal up to a first limiting frequency and the second input amplifier is configured to amplify the second input signal up to a second limiting frequency, the first limiting frequency being lower than the second limiting frequency;
   a controllable switch that selectively connects each of the output terminal of the first input amplifier and the output terminal of the second input amplifier to the internal terminal that generates the internal clock signal;
   wherein the output terminal of the second input amplifier is connected via the controllable switch to the internal terminal that generates the internal clock signal when the input terminal of the second input amplifier is driven by the second input signal, otherwise the output terminal of the first input amplifier is connected via the controllable switch to the internal terminal that generates the internal clock signal.

2. The integrated semiconductor memory device of claim 1, wherein the second input amplifier includes a first input terminal to apply a first clock signal and a second input terminal to apply a second clock signal, each of the first and second clock signals has a first level or a second level, and the output terminal of the second input amplifier is connected via the controllable switch to the internal terminal that generates the internal clock signal when the first input terminal of the second input amplifier is driven by the first level of the first clock signal or when the second input terminal of the second input amplifier is driven by the first level of the second clock signal.

3. The integrated semiconductor memory device of claim 1, further comprising:
   a control circuit to control the controllable switch from a first switch position to a second switch position and from the second switch position to the first switch position;
   wherein:
   the second input amplifier is connected to the control circuit;
   the controllable switch is configured such that, in the first switch position the controllable switch connects the internal terminal that generates the internal clock signal to the output terminal of the first input amplifier when the controllable switch is driven by the control circuit with a control signal in a first state; and
   the controllable switch is configured such that, in the second switch position, the controllable switch connects the internal terminal that generates the internal clock signal to the output terminal of the second input amplifier when the controllable switch is driven by the control circuit with the control signal in a second state.

4. The integrated semiconductor memory device of claim 1, further comprising:
   a third input amplifier to amplify a level of a third input signal, the third amplifier including an input terminal to apply the third input signal;
   wherein the control circuit is connected to the first input amplifier and to the third input amplifier and is configured to drive the controllable switch with a control signal in a first state when the input terminal of the first input amplifier is driven by a selected number of clock cycles of the first input signal and the input terminal of the third input amplifier is subsequently driven with a bit sequence.

5. The integrated semiconductor memory device of claim 4, wherein the control circuit is further configured to evaluate the bit sequence fed to the control circuit from the third input amplifier by comparing the fed bit sequence with a stored bit sequence, and, when the fed bit sequence matches the stored bit sequence, the control circuit drives the controllable switch with the first state of the control signal to control the controllable switch.

6. The integrated semiconductor memory device of claim 4, further comprising:
   a plurality of memory cells, wherein a memory state can be stored in each memory cell;
   a supply terminal to apply a supply voltage;
   a detector circuit configured to detect a level of the supply voltage; and
   a fourth input amplifier to amplify a level of a reset signal, the fourth input amplifier including an input terminal to apply the reset signal with an active state or an inactive state;
   wherein the integrated semiconductor memory device operates in an initial state by configuration settings being reset when the reset signal is in the active state, the control circuit is connected to the fourth input amplifier and to the detector circuit, and the control circuit is further configured to evaluate the bit sequence when the detector circuit detects a desired level of the supply voltage and the reset signal is in the active state.

7. The integrated semiconductor memory device of claim 6, further comprising:
   a first control input to apply a first control signal and a second control terminal to apply a second control signal;
   wherein, in a mirror operating mode of the integrated semiconductor memory device, the first control signal is present at the second control terminal and the second control signal is present at the first control terminal, and the control circuit is further configured such that, for a read and write access to one of the memory cells in the mirror operating mode, the control circuit evaluates the first control signal at the second control terminal and the second control signal at the first control terminal when the detector circuit has detected a desired level of the supply voltage, the reset signal is in the inactive state and the third input signal is in an active state and is present at the third input amplifier.

8. The integrated semiconductor memory device of claim 7, further comprising:
an output terminal to output states of the control signals; and
a register to store states of the control signals;
wherein the control circuit is further configured to buffer-store states of the control signals that are present at control inputs in the register and to output the states of the control signals that are buffer-stored in the register when the detector circuit has detected the desired level of the supply voltage, the reset signal is in the inactive state and the first input signal is in an active state and is present at the first input amplifier.

9. The integrated semiconductor memory device of claim 8, further comprising:
a fifth input amplifier to amplify a level of a chip select signal, the fifth input amplifier including an input terminal to apply the chip select signal;
wherein the integrated semiconductor memory device is selected for read and write access when the chip select signal changes from an inactive state to an active state, and the control circuit is further configured to buffer-store the states of the control signals that are present at the control inputs in the register synchronously with a clock signal present at the input terminal of the fifth input amplifier when the detector circuit has detected the desired level of the supply voltage, the reset signal is in the inactive state and the first input signal is in the active state and is present at the first input amplifier.

10. The integrated semiconductor memory device of claim 9, wherein the control circuit is further configured to interrupt the evaluation of the bit sequence fed to the control circuit from the third input amplifier and to drive the controllable switch with the second state of the control signal that controls the controllable switch when one of the following conditions occurs: the input terminal that applies the second input signal is driven by the second input signal, the reset signal is in the inactive state, and the chip select signal changes from the inactive state to the active state.

11. The integrated semiconductor memory device as claimed in claim 9, wherein the control circuit is further configured to drive the controllable switch with the second state of the control signal when one of the following conditions occurs: the input terminal of the second input amplifier is driven by the second input signal, the reset signal is in the inactive state, the chip select signal changes from the inactive state to the active state, and the input terminal of the third input amplifier is driven by the third input signal in the active state.

12. The integrated semiconductor memory device of claim 1, wherein the control circuit is further configured to change the controllable switch from a first switch position into a second switch position when the input terminal of the second input amplifier is driven by the second input signal.

13. A method for operating an integrated semiconductor memory device, comprising:
providing an integrated semiconductor memory device, the integrated semiconductor memory device comprising:
memory cells, wherein each memory cell is configured to store a memory state;
an internal terminal to generate an internal clock signal, wherein read and write accesses to one of the memory cells is achieved synchronously with the profile of the internal clock signal;
a first input amplifier to amplify a level of a first input signal, the first amplifier including an input terminal to apply the first input signal and an output terminal to generate a first output signal;
a second input amplifier to amplify a level of a second input signal, the second input amplifier including an input terminal to apply the second input signal and an output terminal to generate a second output signal;
a third input amplifier to amplify a level of a third input signal, the third input amplifier including an input terminal to apply the third input signal and an output terminal to generate a third output signal;
wherein the first, second and third input amplifiers generate their respective output signals with a first level or second level depending on a level of their respective input signals, the first input amplifier amplifies the first input signal up to a first limiting frequency and the second input amplifier amplifies the second input signal up to a second limiting frequency, the first limiting frequency being lower than the second limiting frequency;
a controllable switch that selectively connects the first input amplifier to the internal terminal that generates the internal clock signal and the second input amplifier to the internal terminal that generates the internal clock signal;
a fourth input amplifier to amplify a level of a reset signal, the fourth input amplifier including an input terminal to apply the reset signal;
wherein the integrated semiconductor memory device is configured to carry out read and write access when the reset signal is in an inactive state, and the integrated semiconductor memory device operates in an initial state via configuration settings being reset when the reset signal is in an active state;
applying the reset signal in the inactive state to the input terminal of the fourth input amplifier;
subsequently applying a selected number of clock periods of a clock signal to the input terminal of the first input amplifier;
subsequently applying a bit sequence to the input terminal of the third input amplifier;
evaluating the bit sequence via the control circuit by comparing the bit sequence with a stored bit sequence;
switching the controllable switch into a first switch position, in which the first input amplifier is connected to the internal terminal that generates the internal clock signal, when the bit sequence matches the stored bit sequence; and
switching the controllable switch into a second switch position, in which the second input amplifier is connected to the internal terminal that generates the internal clock signal, when the second input signal is applied to the input terminal of the second input amplifier.

14. The method of claim 13, further comprising:
Further providing the integrated semiconductor memory device with control inputs, to which a respective control signal for external control of the read and write accesses is applied, and a supply terminal to apply a supply voltage;
operating the integrated semiconductor memory device in a normal operating mode for carrying out a read and write access to one of the memory cells, wherein a first one of the control signals is applied to a first one of the control terminals and a second one of the control signals is applied to a second one of the control terminals when the supply voltage is present at a desired level at the supply terminal, the reset signal is in the inactive state and the third input signal is in an inactive state and is present at the third input amplifier; and operating the integrated semiconductor memory device in a mirror operating mode for carrying out a read and write access to one of the memory cells, wherein the first one of the control signals is applied to the second one of the control terminals and the second one of the control signals is applied to the first one of the control terminals when the supply voltage is present at the desired level at the supply terminal, the reset signal is in the inactive state and the third input signal is in an active state and is present at the third input amplifier.

15. The method of claim 13, further comprising:

Further providing the integrated semiconductor memory device with an output terminal to generate states of the control signals, and a register to store states of the control signals;

applying the control signals to a respective one of the control terminals of the integrated semiconductor memory device;

buffer-storing the states of the control signals in the register when the supply voltage is at the desired level and is present at the supply terminal, the reset signal is in the inactive state and the first input signal is in an active state and is present at the first input amplifier; and subsequently outputting the states of the control signals that are buffer-stored in the register at the output terminal that generates the states of the control signals.

16. The method of claim 13, further comprising:

after switching the controllable switch into the first switch position, applying the reset signal in the inactive state, wherein the controllable switch remains in the first switch position until the second input amplifier is driven with the second input signal.

17. The method of claim 13, further comprising:

further providing the integrated semiconductor memory device with a fifth input amplifier to amplify a level of a chip select signal so as to select the integrated semiconductor memory device a read and write access when the chip select signal changes from an inactive state into an active state, and an input terminal to apply the chip select signal;

interrupting the evaluation of the bit sequence when one of the following conditions occurs: the second input amplifier is driven with the second input signal, the fourth input amplifier is driven with the fourth input signal in the inactive state, and the fifth input amplifier is driven by a state change of the chip select signal from the inactive state into the active state; and after interrupting the evaluation of the bit sequence, switching the controllable switch into the second switch position, wherein the second input amplifier is connected to the internal terminal that generates the internal clock signal.

18. The method of claim 13, further comprising:

switching the controllable switch into the second switch position, wherein the second input amplifier is connected to the internal terminal that generates the internal clock signal, when one of the following conditions occurs: the second input amplifier is driven with the second input signal, the third input amplifier is driven by the third input signal in the active state, the fourth input amplifier is driven with the reset signal in the inactive state, and the fifth input amplifier is driven by a state change of the chip select signal from the inactive state into the active state.

* * * * *